United States Patent
Matsumoto

(10) Patent No.: US 10,444,001 B2
(45) Date of Patent: Oct. 15, 2019

(54) ELECTROMAGNETIC INDUCTION POSITION DETECTION SENSOR

(71) Applicant: Wacom Co., Ltd., Saitama (JP)

(72) Inventor: Yoshiharu Matsumoto, Saitama (JP)

(73) Assignee: WACOM CO., LTD., Saitama (JP)

( * ) Notice: Subject to any disclaimer, the term of this patent is extended or adjusted under 35 U.S.C. 154(b) by 155 days.

(21) Appl. No.: 15/710,524

(22) Filed: Sep. 20, 2017

(65) Prior Publication Data

US 2018/0010900 A1  Jan. 11, 2018

Related U.S. Application Data

(63) Continuation of application No. PCT/JP2016/061863, filed on Apr. 13, 2016.

(30) Foreign Application Priority Data

Apr. 17, 2015 (JP) ................... 2015-085319

(51) Int. Cl.
| | |
|---|---|
| *G01B 7/00* | (2006.01) |
| *G06F 3/046* | (2006.01) |
| *H05K 3/10* | (2006.01) |
| *H05K 3/34* | (2006.01) |
| *G06F 3/041* | (2006.01) |

(Continued)

(52) U.S. Cl.
CPC .............. *G01B 7/003* (2013.01); *G06F 3/046* (2013.01); *G06F 3/0416* (2013.01); *H05K 3/10* (2013.01); *H05K 3/341* (2013.01); *G06F 2203/04103* (2013.01); *H05K 1/095* (2013.01); *H05K 1/16* (2013.01); *H05K 3/1216* (2013.01); *H05K 2201/10151* (2013.01)

(58) Field of Classification Search
None
See application file for complete search history.

(56) References Cited

U.S. PATENT DOCUMENTS

| | | | |
|---|---|---|---|
| 8,860,436 | B2 | 10/2014 | Kobori et al. |
| 9,221,979 | B2 | 12/2015 | Ito et al. |

(Continued)

FOREIGN PATENT DOCUMENTS

| | | |
|---|---|---|
| EP | 2 637 082 A2 | 9/2013 |
| JP | 60-75922 A | 4/1985 |

(Continued)

*Primary Examiner* — Clayton E. LaBalle
*Assistant Examiner* — Jas A Sanghera
(74) *Attorney, Agent, or Firm* — Seed IP Law Group LLP

(57) ABSTRACT

A position detection sensor includes a plurality of position detection loop coils formed on a board made of resin through a thermal process by forming a wiring path pattern made of copper paste that includes copper powder and a binder. Each of the position detection loop coils includes a plurality of first portions that extend on a first surface of the board in a first direction and a plurality of second portions that extend on a second surface of the board in a second direction that is orthogonal to the first direction. The wiring path pattern is disposed on the first surface and the second surface in a connector section that connects the position detection loop coils to external circuitry. The position detection sensor is capable of maintaining accuracy even though the loop coils are formed on the board by the thermal treatment using copper paste.

20 Claims, 8 Drawing Sheets

(51) Int. Cl.
*H05K 1/09* (2006.01)
*H05K 1/16* (2006.01)
*H05K 3/12* (2006.01)

(56) References Cited

U.S. PATENT DOCUMENTS

2013/0234730 A1* 9/2013 Kobori .................. G01B 7/004
 324/654
2015/0380123 A1 12/2015 Yatsuka et al.

FOREIGN PATENT DOCUMENTS

| | | |
|---|---|---|
| JP | 9-55568 A | 2/1997 |
| JP | 2013-186784 A | 9/2013 |
| JP | 2015-35331 A | 2/2015 |
| WO | 2012/157704 A1 | 11/2012 |
| WO | 2014/132961 A1 | 9/2014 |
| WO | 2014/188812 A1 | 11/2014 |

* cited by examiner

ELECTROMAGNETIC INDUCTION POSITION DETECTION SENSOR

BACKGROUND

Technical Field

The present disclosure relates to an electromagnetic induction position detection sensor.

Description of the Related Art

An electromagnetic induction position detection sensor is formed by a number of loop coils disposed in X-axis and Y-axis directions of coordinate axes on a board. A position detection device having a position detection sensor permits detection of coordinates of a position pointed to by a position pointer in the X-axis and Y-axis directions based on electromagnetic induction action between the position pointer and the position detection sensor.

Conventional position detection sensors were fabricated by etching copper on an epoxy resin board. Recent years have seen use of position detection devices in compact portable terminals. For this reason, position detection sensors have also been required to be more compact and lighter in weight. Therefore, screen-printed position detection sensors using metal paste that are lower in cost than etched ones and that can be volume-produced have come into use.

Metal paste used not only for position detection sensors but also for ordinary circuit boards includes metallic powder and a resin binder (bonding agent). Then, metal paste applied to the circuit board is subjected to a thermal treatment so that conductivity is enhanced by fusing the metal powder to each other.

Heat-resistant polyimide-based resin sheet is used as a board material on which to screen-print a metal paste. Also, a metal, particularly used as a metal powder of metal paste, is silver. A position detection sensor having a board coated with silver paste through screen printing offers high conductivity and can be fabricated by heating at approximately 200° C. to 250° C., relatively low temperatures for a thermal treatment, for approximately 20 to 30 minutes, and, therefore, has become popular.

However, fabricating a position detection sensor using silver paste had the following problems. First, silver paste is expensive, resulting in higher cost than conventional copper etching. Also, in order to achieve downsizing while at the same time maintaining the number of loop coils of the position detection sensor in today's compact portable terminals against the backdrop of demands for more compact terminals, it is necessary to reduce a loop coil width and a spacing between the loop coils to the extent possible. However, if silver paste is used, the coil spacing cannot be reduced due to ion migration phenomenon. This has led to a problem characterized by difficulties in fabricating compact position detection sensors using silver paste.

For this reason, use of copper paste using copper powder that is cheaper and free from ion migration phenomenon has been proposed in place of silver (refer to Patent Document 1 (WO2012/157704)).

As described in Patent Document 1, however, copper powder has a drawback in that it is prone to formation of an oxide film on the surface and its conductivity degrades due to an oxide layer. In the case of copper in particular, conventional temperatures and heating time result in formation of an oxide film. For this reason, forming loop coils on a sheet-shaped board using copper paste requires a reduction process at temperatures beyond 300° C., temperatures higher than for silver paste, to reduce the oxide film of copper powder, a sintering process at higher temperature, and a short-time thermal treatment to provide resistance to formation of an oxide film.

However, if loop coils are formed on a sheet-shaped board made of polyimide-based resin using copper paste under such high temperatures, a binder included in the copper paste shrinks, leading to shrinkage of paste wiring itself made of copper paste. This shrinkage exerts a shrinking force on the sheet-shaped board, causing problems including warping and undulation on the sheet-shaped board depending on the location. In the event of such warping or undulation, the size of the position detection sensor itself changes, rendering it impossible to detect positions with accuracy.

As a method for reducing this warping caused by shrinkage, a method is proposed in Patent Document 2 (Japanese Patent Laid-Open No. Hei 9-55568) that prints copper paste wiring on both front and back faces of a board.

PRIOR ART DOCUMENT

Patent Documents

Patent Document 1: WO2012/157704
Patent Document 2: Japanese Patent Laid-Open No. Hei 9-55568

BRIEF SUMMARY

Technical Problems

However, there was a problem with applying the method of Patent Document 2 in an 'as-is' fashion to a position detection sensor. That is, wiring is printed on both faces to eliminate warping of the board. However, if there is an imbalance in wiring between one face the other face, wrinkles and undulations occur.

For example, as depicted in FIG. 10A, no problem arose if wiring paths 2 made of copper paste were successfully formed, one on one face 1a and another on another face 1b, at positions opposed to each other on a sheet-shaped board 1. However, as depicted in FIG. 10B, in the event of an unevenness between positions of the wiring paths 2 due to misalignment from the opposing positions, the binder shrank, causing an undulation problem as depicted in FIG. 10C.

Then, a position detection sensor has areas where wiring is partially concentrated and areas where wiring is distributed unevenly in one direction such as a connector section between the position detection sensor and a position detection circuit. In such areas, wrinkle and undulation problems occurred despite wiring printed on both faces using the method described in Patent Document 2.

It is an object of the present disclosure to provide an electromagnetic induction position detection sensor that solves the above problems.

Technical Solution

In order to solve the above problems, the present disclosure teaches an electromagnetic induction position detection sensor that has a wiring path pattern made using copper paste that includes copper powder and a binder formed on a board made of resin and that has a plurality of position detection loop coils formed by thermally treating the wiring path pattern. The wiring path pattern includes the position detection loop coils and a connector section that connects the position detection loop coils to external circuitry. Each of the position detection loop coils includes a plurality of first portions that extend on a first surface of the board in a first direction, and a plurality of second portions that extend on a second surface of the board in a second direction that is orthogonal to the first direction. The wiring path pattern is disposed on the first surface and the second surface of the board in the connector section.

In the electromagnetic induction position detection sensor configured as described above, portions of the wiring path pattern that extend on the first surface of the board in the first direction and portions of the wiring path pattern that extend on the first surface of the board in the second direction are formed in the first direction at the given pitch. Therefore, the wiring path patterns made of the copper paste includes portions that are formed in directions orthogonal to each other on the first surface and the second surface of the board.

Then, the portions of the wiring path pattern formed on both surfaces of the board are each formed at the given pitch. As a result, lattices of a given size are formed evenly approximately across the entire board thanks to the portions of the wiring path patterns on both surfaces of the board. Therefore, even in the event of shrinkage of the copper paste binder due to thermal treatment, that shrinkage takes place evenly approximately across the entire board, ensuring freedom from partial warping or undulation. This makes it possible to provide a position detection sensor that offers high accuracy even when copper paste is used.

Also, the present disclosure teaches that, the connector section may be provided, at an end portion of the board, and the connector section includes a plurality of extended portions of lead wiring paths from a loop section of each of the position detection loop coils are formed. Portions of the wiring path that extend on the first surface of the board in the connector section are orthogonal to portions of the wiring path pattern that extend on the second surface of the board in the connector section.

In the electromagnetic induction position detection sensor described above, patterns made of the copper paste are substantially formed in directions orthogonal to each other on the first surface and the other surface of the board in the connector section. Therefore, in the connector section, even in the event of shrinkage of the copper paste binder in the wiring path patterns orthogonal to each other, the connector section as a whole shrinks evenly, preventing warping or undulation of the connector section.

Advantageous Effects

The electromagnetic induction position detection sensor according to the present disclosure has an effect in that if loop coils are formed on a sheet-shaped board made of a polyimide-based resin using copper paste, and even in the event of shrinkage of a binder included in the copper paste by a thermal treatment, that shrinkage takes place evenly approximately across the entire sheet-shaped board, and as a result, the sheet-shaped board is kept free from partial warping or undulation. The position detection sensor also has an effect in that accuracy can be maintained.

MODES FOR CARRYING OUT THE DISCLOSURE

A description will be given below of embodiments of an electromagnetic induction position detection sensor according to the present disclosure with reference to drawings.
[First Embodiment]
[Description of Electromagnetic Induction Coordinate Input Device]

First, before describing a first embodiment of the position detection sensor according to the present disclosure, a configuration example of an electromagnetic induction coordinate input device using the position detection sensor of embodiments of the present disclosure described below will be described with reference to FIG. 2. A pen-type position pointer 300 used together with an electromagnetic induction coordinate input device 200 in this example incorporates a parallel resonance circuit that includes a coil 301 and a capacitor 302 connected in parallel to the coil 301 as illustrated in FIG. 2.

Figure 2:
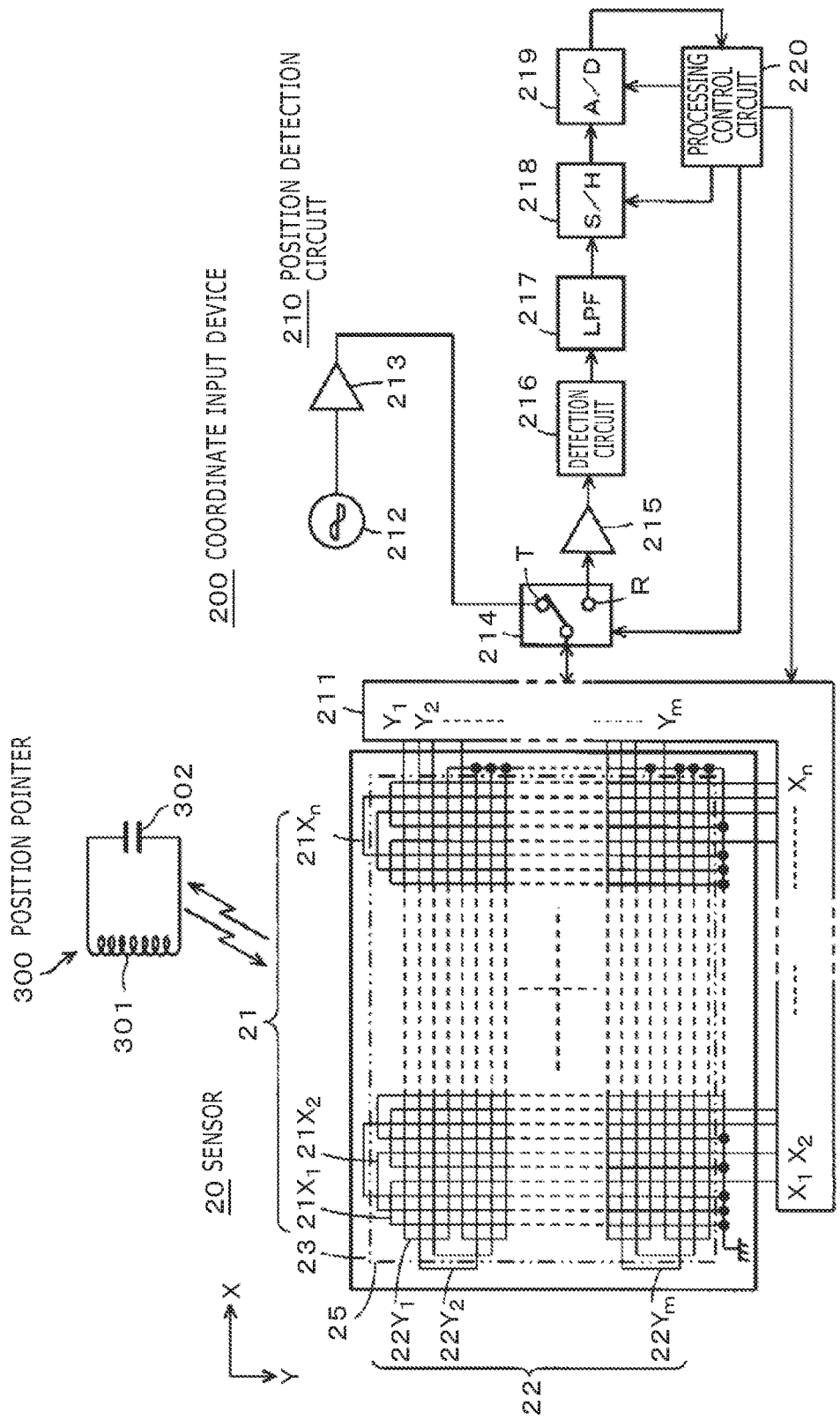
FIG. 2 is a block diagram for describing a position detection circuit of a coordinate input device using a position detection sensor according to an embodiment of the present disclosure.

In a position detection sensor 20 of the coordinate input device 200 in this example, a loop coil group 21 running in an X-axis direction and a loop coil group 22 running in a Y-axis direction are disposed on each of a top face and a rear face of a sheet-shaped board 23 made of polyimide-based resin in such a manner as to spatially overlap each other as illustrated in FIG. 2. It should be noted that in the example described below the direction across the board of the position detection sensor 20 is assumed to be the X-axis direction, and the direction down the board of the position detection sensor 20 is assumed to be the Y-axis direction.

In the case of this example, as depicted in FIG. 2, the loop coil group 21 running in the X-axis direction includes n (where n is an integer equal to 2 or more) rectangular loop coils $21X_1$ to $21X_n$ that are arranged at a given pitch in the X-axis direction, and the loop coil group 22 running in the Y-axis direction includes m (where m is an integer equal to 2 or more) loop coils $22Y_1$ to $22Y_m$ that are arranged at a given pitch in the Y-axis direction. In the position detection sensor 20, a position detection area 25 includes a loop section of the loop coil group 21 running in the X-axis direction and a loop section of the loop coil group 22 running in the Y-axis direction.

Two wiring paths are led out from each of the loop section of the loop coil group 21 running in the X-axis direction and the loop section of the loop coil group 22 running in the Y-axis direction as described earlier. Each one of the wiring paths (return wiring path which will be described later) is connected to each other as illustrated in FIG. 2 and connected to a terminal supplied with a reference potential, a ground terminal in the example depicted in FIG. 2.

The position detection sensor 20 is connected to a position detection circuit 210 via a connector section that is omitted in the figure. The position detection circuit 210 includes a selection circuit 211, an oscillator 212, a current driver 213, a transmission/reception switching circuit 214, a receiving amplifier 215, a detection circuit 216, a low-pass filter 217, a sample-hold circuit 218, an analog to digital (A/D) conversion circuit 219, and a processing control circuit 220.

The X-axis direction loop coil group 21 and the Y-axis direction loop coil group 22 are connected to the selection circuit 211. The selection circuit 211 successively selects one of the loop coils of the two loop coil groups 21 and 22 in accordance with a control instruction from the processing control circuit 220.

The oscillator 212 generates an alternating current (AC) signal at a frequency f0. This AC signal is supplied to the current driver 213 for conversion into a current and then sent to the transmission/reception switching circuit 214. The transmission/reception switching circuit 214 switches, every given time period, between connection destinations (transmitting side terminal T and receiving side terminal R) to which the loop coil selected by the selection circuit 211 is connected under control of the processing control circuit 220. The current driver 213 is connected to the transmitting side terminal T, and the receiving amplifier 215 is connected to the receiving side terminal R.

During transmission, therefore, the AC signal from the current driver 213 is supplied to the loop coil selected by the selection circuit 211 via the transmitting side terminal T of the transmission/reception switching circuit 214. During reception, on the other hand, the induced voltage generated in the loop coil selected by the selection circuit 211 is supplied to the receiving amplifier 215 via the selection circuit 211 and the receiving side terminal R of the transmission/reception switching circuit 214 for amplification and sent to the detection circuit 216.

The signal detected by the detection circuit 216 is supplied to the A/D conversion circuit 219 via the low-pass filter 217 and the sample-hold circuit 218. The A/D conversion circuit 219 converts the analog signal into a digital signal and supplies the signal to the processing control circuit 220.

The processing control circuit 220 performs control for position detection. That is, the processing control circuit 220 controls loop coil selection by the selection circuit 211, signal switching by the transmission/reception switching circuit 214, timings of the sample-hold circuit 218, and so on.

The processing control circuit 220 controls energization of the loop coil selected by the selection circuit 211 of the X-axis direction loop coil group 21 or the Y-axis direction loop coil group 22 to send electromagnetic waves by switching the transmission/reception switching circuit 214 for connection to the transmitting side terminal T. The resonance circuit of the position pointer 300 receives electromagnetic waves sent from this loop coil and stores energy.

Next, the processing control circuit 220 switches the transmission/reception switching circuit 214 for connection to the receiving side terminal R. Then, an induced voltage is generated in each of the loop coils of the X-axis direction loop coil group 21 and the Y-axis direction loop coil group 22 by electromagnetic waves sent from the position pointer 300. The processing control circuit 220 calculates coordinate values of the position pointed to in the X-axis and Y-axis directions in the position detection area 25 of the position detection sensor 20 based on the voltage level of the induced voltage generated in each of the loop coils. Then, the processing control circuit 220 supplies calculated coordinate value information, for example, to an external personal computer.

[First Embodiment of Position Detection Sensor of Present Disclosure]

Figure 1:
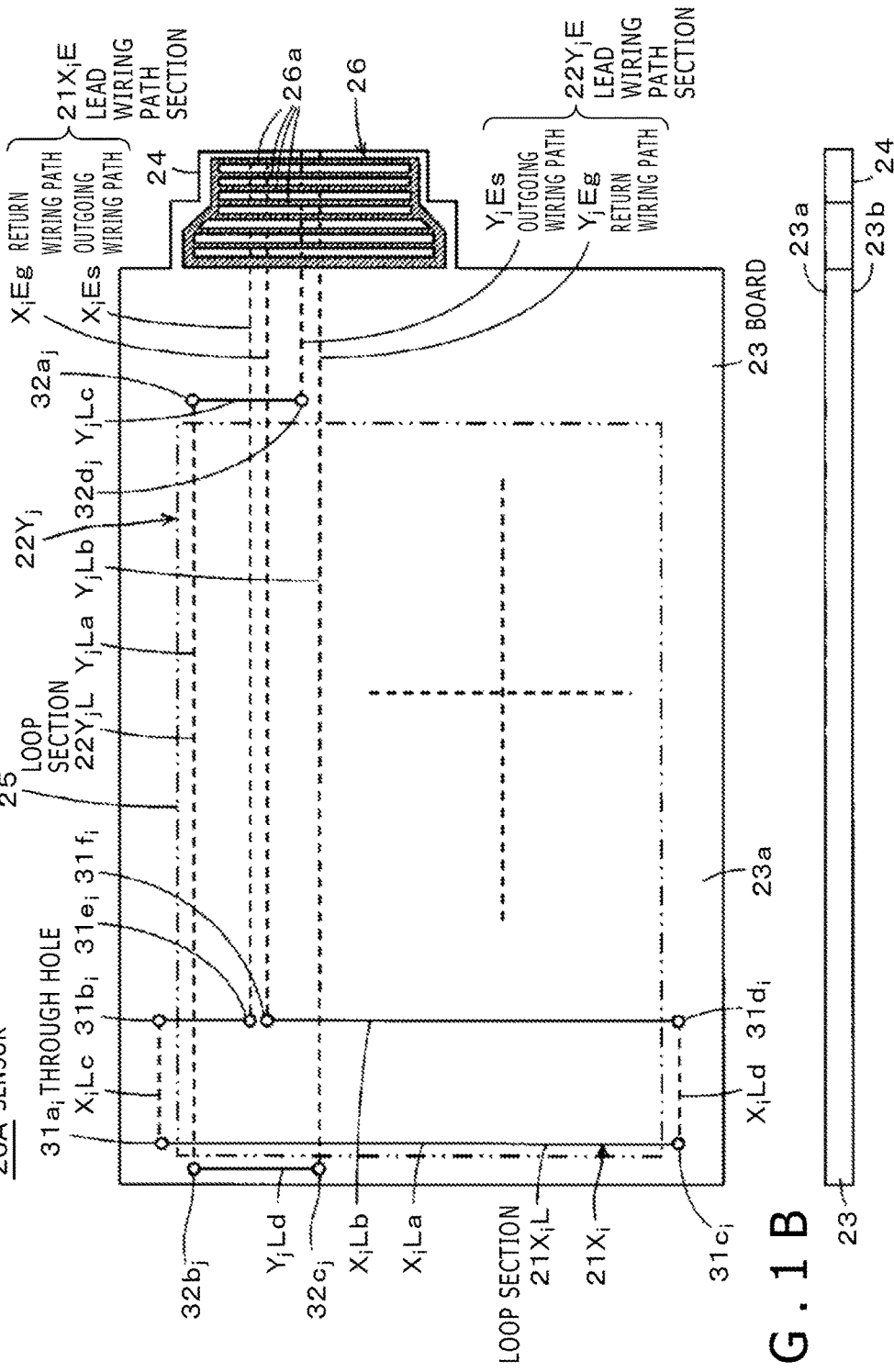
FIGS. 1A and 1B depict diagrams illustrating a configuration example of a position detection sensor according to an embodiment of the present disclosure.

FIGS. 1A and 1B depict diagrams for describing a position detection sensor 20A of the first embodiment applied to the position detection sensor 20 illustrated in FIG. 2. This drawing is intended to describe how each of loop coils $21X_i$ (where i is any one of 1, 2 and so on up to n) of the X-axis direction loop coil group 21 and each of loop coils $22Y_j$ (where j is any one of 1, 2 and so on up to m) of the Y-axis direction loop coil group 22 are formed with respect to the sheet-shaped board 23.

FIG. 1A is a view as seen from the side of one face 23a of the board 23, and FIG. 1B is a view as seen from a direction vertical to the face 23a of the board 23. In FIG. 1B, illustration of a conductor pattern making up the loop coils $21X_i$ and $22Y_j$ is omitted.

As illustrated in FIGS. 1A and 1B and as described earlier, the sheet-shaped board 23 in this example is a thin film-shaped flexible board made of polyimide-based resin. Then, straight line portions $X_iLa$ and $X_iLb$ parallel to the Y-axis direction of a loop section $21X_iL$ shaped to surround a rectangular area of the X-axis direction loop coil $21X_i$ are formed on the side of the one face 23a of the sheet-shaped board 23 (hereinafter referred to as the board 23), and straight line portions $X_iLc$ and $X_iLd$ parallel to the X-axis direction to connect the straight line portions $X_iLa$ and $X_iLb$ of the loop section $21X_iL$ are formed on the side of the other face 23b of the board 23. The straight line portions $X_iLa$ and $X_iLb$ on the side of the one face 23a of the board 23 are connected to the straight line portions $X_iLc$ and $X_iLd$ on the side of the other face 23b via through holes $31a_i$, $31b_i$, $31c_i$, and $31d_i$.

Then, one of the straight line portions $X_iLa$ and $X_iLb$ of the loop section $21X_iL$ provided on the side of the one face 23a of the board 23, which is the straight line portion $X_iLb$ in the case of FIGS. 1A and 1B, is cut in the middle for connection to a lead wiring path section $21X_iE$ that includes first and second wiring paths that are parallel to each other.

One of the first and second wiring paths making up the lead wiring path section $21X_iE$ is connected to the selection circuit 211 of the position detection circuit 210 described earlier via the connector section 24 and serves as a wiring path to which a signal is supplied or from which a signal is extracted. This wiring path to which a signal is supplied or from which a signal is extracted will be hereinafter referred to as an outgoing wiring path. On the other hand, the other of the first and second wiring paths making up the lead wiring path section $21X_iE$ is a wiring path connected to a reference potential such as ground potential. This wiring path connected to a reference potential such as ground potential will be hereinafter referred to as a return wiring path.

One end portion of a cut portion of the straight line portion $X_iLb$ of the loop section $21X_iL$ of the X-axis direction loop coil $21X_i$ is connected, via a through hole $31e_i$, to an outgoing wiring path $X_iEs$ of the lead wiring path section $21X_iE$ formed on the side of the other face $23b$ of the board 23, and other end portion of the cut portion of the straight line portion $X_iLb$ is connected, via a through hole $31f_i$, to a return wiring path $X_iEg$ of the lead wiring path section $21X_iE$ formed on the side of the other face $23b$ of the board 23. The outgoing wiring path $X_iEs$ and the return wiring path $X_iEg$ are disposed in parallel and in proximity to each other as straight lines in the X-axis direction in this example.

As illustrated in FIGS. 1A and 1B, the lead wiring path section $21X_iE$ of the X-axis direction loop coil $21X_i$ also exists in the position detection area 25 in this example. At least, the outgoing wiring path $X_iEs$ and the return wiring path $X_iEg$ of the lead wiring path section $21X_iE$ in the position detection area 25 are disposed as straight lines that run in proximity and in parallel to each other in the X-axis direction. A spacing between the outgoing wiring path $X_iEs$ and the return wiring path $X_iEg$ is, for example, 0.1 mm.

The outgoing wiring path $X_iEs$ and the return wiring path $X_iEg$ are straight lines that run in proximity and in parallel to each other as described above to keep to a minimum an error signal at the time of position detection by the position detection circuit. The error signal is an unnecessary current produced because of the existence of the lead wiring path section $21X_iE$ in the position detection area 25 and as a result of the passage of magnetic fluxes through a thin and narrow surface formed by the pair of straight lines.

Then, in this example, the outgoing wiring path $X_iEs$ and the return wiring path $X_iEg$ of the lead wiring path section $21X_iE$ are disposed in such a manner as to extend up to the connector section 24 provided outside the position detection area 25 on the other face $23b$ of the board 23.

Then, on the board 23, the plurality of X-axis direction loop coils $21X_i$ configured as described above are disposed in the X-axis direction at a given pitch with the loop sections $21X_iL$ partially overlapping each other.

Also, straight line portions $Y_jLa$ and $Y_jLb$ parallel to the X-axis direction of a loop section $22Y_jL$ shaped to surround a rectangular area of the Y-axis direction loop coil $22Y_j$ are formed on the side of the other face $23b$ of the board 23. Then, straight line portions $Y_jLc$ and $Y_jLd$ parallel to the Y-axis direction to connect the straight line portions $Y_jLa$ and $Y_jLb$ of the loop section $22Y_jL$ are formed on the side of the one face $23a$ of the board 23. The straight line portions $Y_jLa$ and $Y_jLb$ on the side of the other face $23b$ of the board 23 and the straight line portions $Y_jLc$ and $Y_jLd$ on the side of the one face $23a$ are connected via through holes $32a_j$, $32b_j$, and $32c_j$.

Then, one of the straight line portions $Y_jLa$ and $Y_jLb$ of the loop section $22Y_jL$ of the Y-axis direction loop coil $22Y_j$ provided on the side of the other face $23b$ of the board 23, which is the straight line portion $Y_jLb$ in the example depicted in FIGS. 1A and 1B, is extended further outward beyond the position detection area 25 up to the connector section 24 in the X-axis direction and serves as a return wiring path $Y_jEg$ of the lead wiring path section $22Y_jE$. Also, the straight line portion $Y_jLc$ of the loop section $22Y_jL$ located closest to the connector side in the X-axis direction in the position detection area 25 is connected to an outgoing wiring path $Y_jEs$ of the lead wiring path section $22Y_jE$ formed in the X-axis direction on the side of the other face $23b$ of the board 23 via the through hole $32d_j$. The outgoing wiring path $Y_jEs$ is disposed in parallel and in proximity to the return wiring path $Y_jEg$ and extended up to the connector section 24.

Then, on the board 23, the plurality of Y-axis direction loop coils $22Y_j$ configured as described above are disposed in the Y-axis direction at a given pitch with the loop sections $22Y_jL$ partially overlapping each other.

As described above, in the position detection sensor 20A, the plurality of X-axis direction loop coils $21X_i$ and the plurality of Y-axis direction loop coils $22Y_j$ are disposed in the directions orthogonal to each other on the one face $23a$ and the other face $23b$ of the board 23 in the position detection area of the board 23. As a result, lattices of a given size are formed evenly approximately across the entire board 23 thanks to the plurality of wiring path patterns of loop coils on both faces of the board 23.

Then, on the other face $23b$ of the connector section 24, the lead wiring path section $21X_iE$ from the plurality of X-axis direction loop coils $21X_i$ and the lead wiring path section $22Y_jE$ from the plurality of Y-axis direction loop coils $22Y_j$ are formed parallel to each other in such a manner as to be drawn out in the X-axis direction.

In the present embodiment, a dummy conductor pattern 26 having a plurality of wiring path patterns 26a is formed on the one face $23a$ of the connector section 24 as illustrated in FIG. 1A. The wiring path patterns 26a run in a direction orthogonal to the lead wiring path section $21X_iE$ and the lead wiring path section $22Y_jE$ in a region opposed to the lead wiring path section $21X_iE$ from the plurality of X-axis direction loop coils 21X, and the lead wiring path section $22Y_jE$ from the plurality of Y-axis direction loop coils $22Y_j$ on the side of the other face $23b$.

In the present embodiment, the plurality of wiring path patterns 26a are formed by forming slits in the Y-axis direction in the dummy conductor pattern 26. It should be noted, however, that, in the present embodiment, the plurality of wiring path patterns 26a are connected to each other at their end portions.

In the position detection sensor 20A of the present embodiment, therefore, wiring path patterns orthogonal to each other are also substantially formed in the connector section 24 of the board 23.

The position detection sensor 20A described above is fabricated, for example, by coating the one face $23a$ and other face $23b$ of the sheet-shaped board 23 with copper paste through screen printing and forming the X-axis loop coil group and the Y-axis loop coil group described above (including the connector sections). Here, copper paste includes copper powder, a solvent, and binder resin. It should be noted that the method described, for example, in Japanese Patent Laid-Open No. 2015-35331 can be used as a manufacturing method of a conductive coating film using the copper paste.

The copper paste coated on the board 23 is subjected to a superheated steam treatment, reducing the oxidized copper, and changing the copper paste into wiring paths having high electrical conductivity with a specific resistance of 10 Ω·cm or less. In the present embodiment, the superheated steam treatment is conducted for one to two minutes in a temperature range from 320° C. to 370° C. Here, the temperature of the superheated steam treatment is determined in consideration of the conductivity (specific resistance) of the copper paste and shrinkage rate that occurs in the polyimide-based resin board 23.

Figure 3:
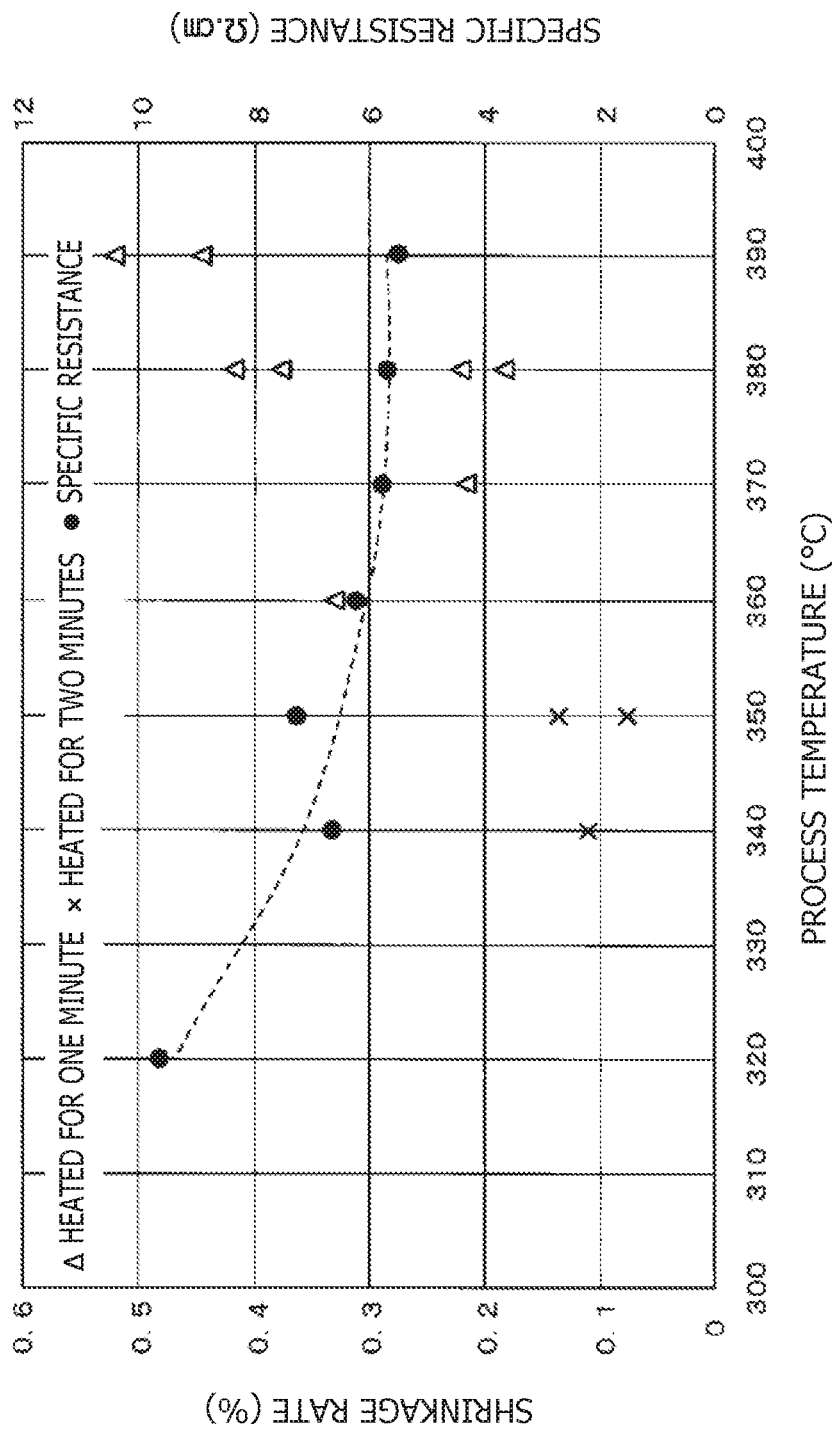
FIG. 3 is a diagram used to describe a configuration example of a position detection sensor according to an embodiment of the present disclosure.

FIG. 3 is a diagram illustrating a relationship between the shrinkage rate of the board 23 with a change in temperature during the superheated steam treatment and the specific resistance of the wiring paths made of copper paste formed on the board 23. When the specific resistance is large, it is difficult to pass a current through the loop coils, making it difficult for the position detection sensor to conduct detection operation. When the shrinkage rate of the board 23 is large, the loop coils deform, degrading the coordinate position accuracy of the position detection sensor.

In FIG. 3, black circles represent the specific resistance of the wiring paths made of copper paste. Also, triangles represent the shrinkage rate of the board 23 subjected to the superheated steam treatment for one minute, and cross marks represent the shrinkage rate of the board 23 subjected to the superheated steam treatment for two minutes.

It is clear from FIG. 3 that the specific resistance drops to 10 Ω·cm or less at 320° C. or more and drops to approximately 6 Ω·cm or less at 370° C. or more, and that the specific resistance roughly saturates without diminishing at higher temperatures. It has also become clear that the shrinkage of the board 23 hardly takes place at 340° C. or less and that shrinkage takes place in different amounts from one location to another in a patchy manner at 370° C. or more.

For this reason, the temperature of the superheated steam treatment was set to fall in the range from 320° C. to 370° C. in the present embodiment, and to 340° C. particularly in this example with a process time of two minutes. This made it possible to reduce the specific resistance while at the same time keeping the shrinkage of the board 23 to a minimum. It should be noted that the process time may be naturally one minute.

Then, even if the copper paste binder shrinks due to a thermal treatment at a high temperature such as 340° C., shrinkage takes place evenly approximately across the entire position detection area 25 of the board 23 because the position detection sensor 20A of the above embodiment has wiring path patterns running in the directions orthogonal to each other formed in an orderly manner at a given pitch on the one and other faces of the board 23 in the position detection area 25. This ensures that the position detection area 25 is free from partial warping or undulation.

It should be noted that the position detection circuit 210 connected to the position detection sensor 20A can correct coordinates pointed to by the position pointer obtained from the position detection sensor in accordance with shrinkage that takes place across the entire board 23 of the position detection sensor 20A. Therefore, even if the board 23 of the position detection sensor 20A shrinks, coordinate accuracy can be maintained high.

Also, in the connector section 24, the wiring path patterns of the lead wiring path section on the one face and the wiring path patterns 26a of the dummy conductor pattern 26 on the other face similarly run orthogonal to each other. As a result, lattice patterns are also formed evenly in the connector section 24, ensuring freedom from partial warping or undulation.

Then, the dummy conductor pattern 26 of the connector section 24 is not a filled pattern that matches with the entire region of the wiring path patterns on the side of the other face 23b of the board 23. Instead, the dummy conductor pattern 26 has slits and, therefore, has an effect in that it is possible to avoid attenuation of magnetic fluxes which would occur in the case of a filled pattern due to generation of eddy currents in electromagnetic coupling with the position pointer near the filled pattern.

[Modification Example of First Embodiment]

It should be noted that although the dummy conductor pattern 26 is configured such that the plurality of wiring path patterns 26a are connected to each other, the dummy conductor pattern 26 may be configured such that each of the plurality of wiring path patterns 26a is independent of other patterns.

Also, although, in the above embodiment, both the outgoing wiring path and the return wiring path of the lead wiring path section $21X_iE$ from the X-axis direction loop coils $21X_i$ and the lead wiring path section $22Y_jE$ from the Y-axis direction loop coils $22Y_j$ are provided on the side of the other face 23b of the connector section 24, the return wiring paths of the lead wiring path section $21X_iE$ from the X-axis direction loop coils $21X_i$ and the lead wiring path section $22Y_jE$ from the Y-axis direction loop coils $22Y_j$ may be connected together to the dummy conductor pattern 26 via a through hole near the connector section 24.

In this case, the dummy conductor pattern 26 is configured in the connector section 24 as a terminal to be connected to a reference potential. Alternatively, one or more of return wiring paths of the lead wiring path section $21X_iE$ from the X-axis direction loop coils $21X_i$ and the lead wiring path section $22Y_jE$ from the Y-axis direction loop coils $22Y_j$ may be drawn out onto the other face 23b of the connector section 24 and connected to the dummy conductor pattern 26 via a through hole so that the return wiring paths drawn out onto the other face 23b of the connector section 24 may be used as terminals to be connected to a reference potential.

Also, although the dummy conductor pattern 26 of the above embodiment substantially has a plurality of wiring path patterns thanks to the slits provided, a plurality of wiring path patterns may be substantially provided by forming, rather than the slit area, void holes having a diameter equal to the width of the slits in the slit area.

[Second Embodiment of Position Detection Sensor]

A position detection sensor of a second embodiment is one of modification examples of the position detection sensor 20A of the first embodiment. FIG. 4A to FIG. 8 are diagrams for describing a configuration example of a position detection sensor 20B of the second embodiment. In FIG. 4A to FIG. 8, the same parts as those of the position detection sensor 20A of the first embodiment will be denoted by the same reference symbols, and a detailed description thereof will be omitted.

In the position detection sensor 20B of the second embodiment, the return wiring path $X_iEg$ of the lead wiring path section $21X_iE$ of the X-axis direction loop coils $21X_i$ formed on the board 23 as described above is combined with the return wiring path $X_kEg$ of the lead wiring path section $21X_kE$ of the other X-axis direction loop coil $21X_k$ (where i≠k) into a common wiring path, reducing the total number of lead wiring paths for connection from the X-axis direction loop coil group 21 to the connector section 24 outside of the position detection area 25. This ensures reduced concentration and imbalance of the wiring path patterns caused by the existence of the lead wiring paths other than the lead wiring paths of the loop sections of the loop coils in the position detection area 25 as compared to the first embodiment.

Also, in the second embodiment, although extended portions of the outgoing wiring paths of the lead wiring path section $21X_iE$ of the X-axis direction loop coils $21X_i$ and the lead wiring path section $22Y_jE$ of the Y-axis direction loop coils $22Y_j$ are formed on the other face 23b of the board 23, the return wiring paths thereof are connected together to a conductor pattern 26B described later that is formed on the one face 23a of the board 23. The reason for this is to ensure that the conductor pattern 26B formed on the one face 23a of the connector section 24 can serve as a terminal conductor of the reference potential.

Figures 4A, 4B:
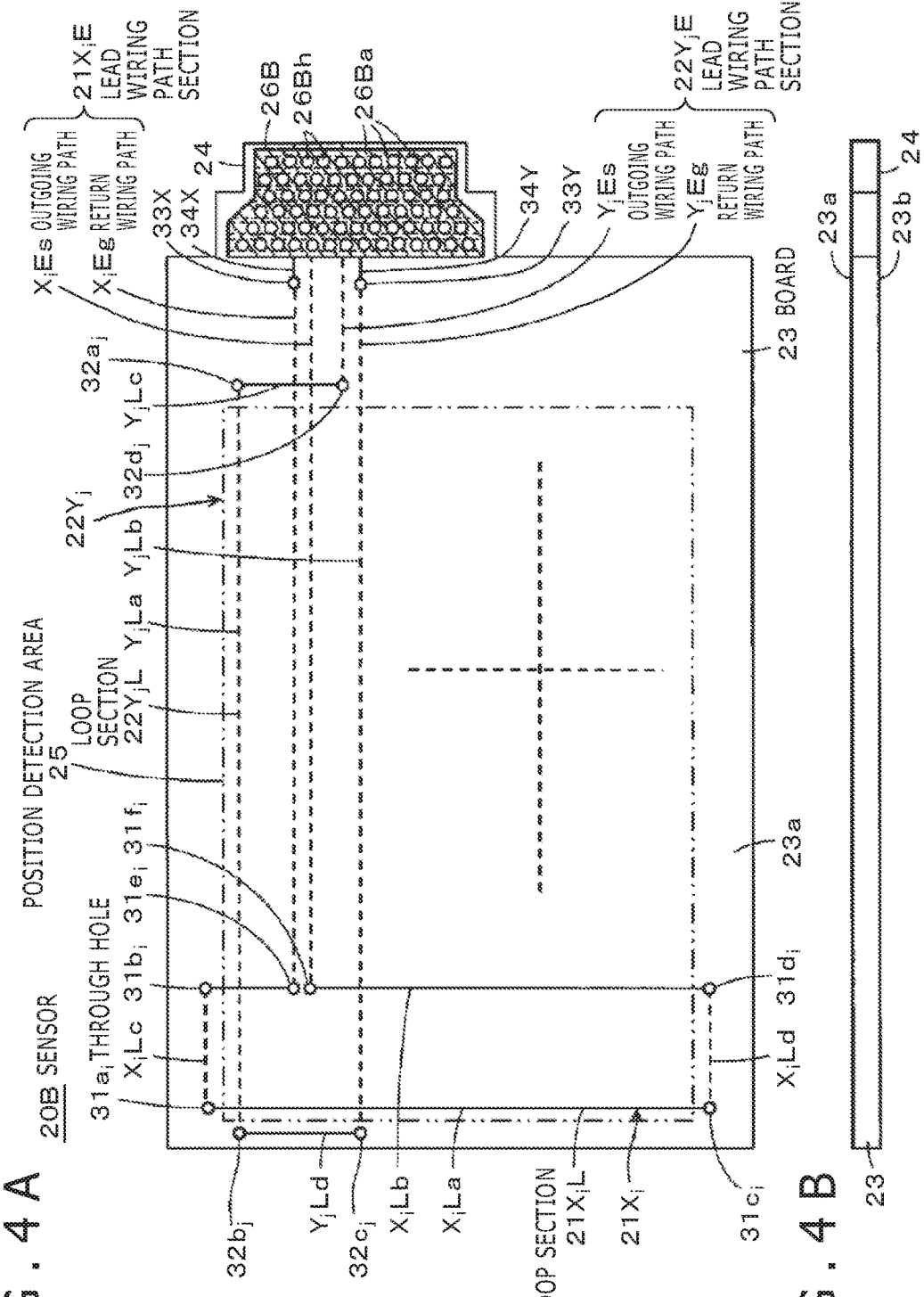
FIGS. 4A and 4B depict diagrams illustrating a configuration example of a position detection sensor according to an embodiment of the present disclosure.

FIGS. 4A and 4B depict diagrams for describing an outline of a configuration example of the position detection sensor 20B of the second embodiment and are equivalent to FIGS. 1A and 1B of the first embodiment. It should be noted that the solid straight lines in FIG. 4A to FIG. 8 represent the wiring paths formed on the one face 23a of the board 23, and the dotted straight lines represent the wiring paths formed on the other face 23b of the board 23 as in FIGS. 1A and 1B.

As illustrated in FIGS. 4A and 4B, in the position detection sensor 20B of the second embodiment, a conductor pattern 26B is formed on one face 23a of the board 23, and the return wiring path $X_iEg$ of the lead wiring path section $21X_iE$ of the X-axis direction loop coil $21X_i$ disposed on the other face 23b of the board 23 and the return wiring path $Y_jEg$ of the lead wiring path section $22Y_jE$ of the Y-axis direction loop coil $22Y_j$ are connected via through holes 33X and 33Y to wiring paths 34X and 34Y on the one face 23a of the board 23 near the connector section 24. The wiring paths 34X and 34Y are connected together to the one face 23a of the connector section 24 of the board 23. The position detection sensor 20B of the second embodiment is similar to the position detection sensor 20A of the first embodiment in other configuration.

The void holes of the conductor pattern 26B are arranged side by side in the Y-axis direction, and these columns of the void holes running in the Y-axis direction are arranged out of alignment with the adjacent columns of the void holes. This arrangement is equal to the formation of void holes 26Bh in the slit area in the dummy conductor pattern 26 of the first embodiment, and wiring path patterns 26Ba are substantially formed in the Y-axis direction in the conductor pattern 26B. It should be noted that although dotted lines are depicted in the conductor pattern 26B in FIGS. 4A and 4B for easy understanding of the wiring patterns 26Ba, these dotted lines do not actually exist.

A description will be given next of the combination of the return wiring path $X_iEg$ of the lead wiring path section $21X_iE$ of the X-axis direction loop coil $21X_i$ and the return wiring path $X_kEg$ of the lead wiring path section $21X_kE$ of the other X-direction loop coil $21X_k$ (where i≠k) into a common wiring path in the position detection sensor 20B of the second embodiment.

Figure 5:
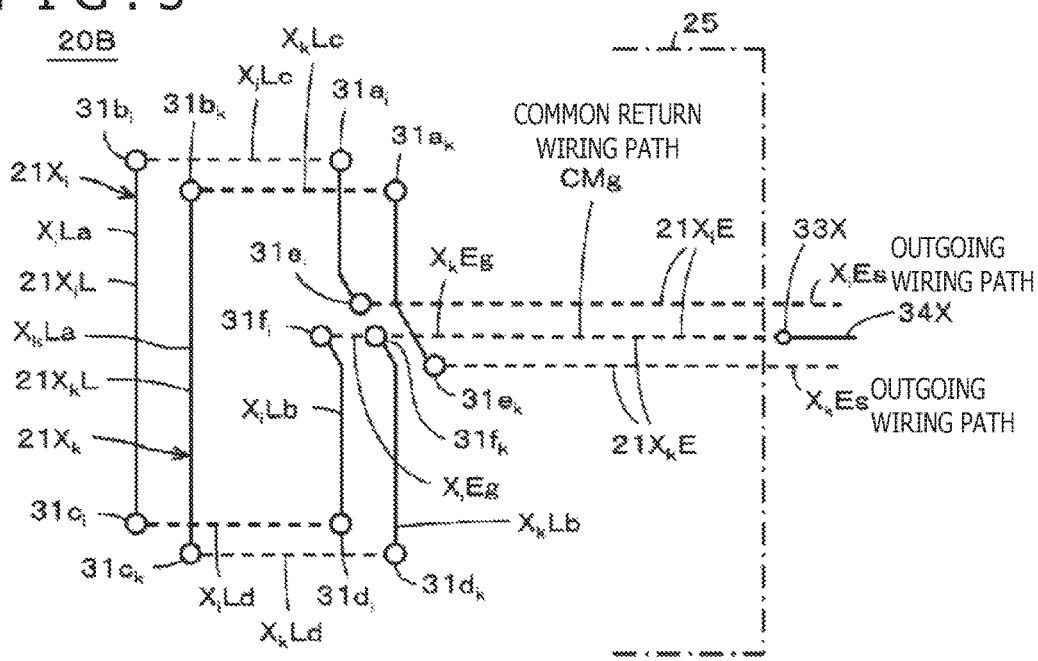
FIG. 5 is a diagram for describing parts of the configuration example of a position detection sensor according to an embodiment of the present disclosure.

FIG. 5 is a diagram for describing the combination, into a common return wiring path, of any two X-axis loop coils out of the X-axis loop coil group 21 formed on the board 23 of the position detection sensor 20B of the second embodiment, and FIG. 5 illustrates a case in which the lead wiring path section $21X_iE$ of the X-axis direction loop coils $21X_i$ and the lead wiring path section $21X_kE$ of the X-axis direction loop coil $21X_k$ into a return wiring path. In FIG. 5, the solid straight lines represent the wiring paths formed on the one face 23a of the board 23, and the dotted straight lines represent the wiring paths formed on the other face 23b of the board 23 as in FIGS. 1A and 1B.

As described earlier, the straight line portions $X_iLa$ and $X_iLb$ of the loop section $21X_iL$ of the X-axis direction loop coil $21X_i$ formed on the one face 23a of the board 23 are connected to the straight line portions $X_iLc$ and $X_iLd$ formed on the other face 23b of the board 23 via the through holes $31a_i$, $31b_i$, $31c_i$, and $31d_i$. Similarly, straight line portions $X_kLa$ and $X_kLb$ of a loop section $21X_kL$ of the X-axis direction loop coil $21X_k$ formed on the one face 23a of the board 23 are connected to straight line portions $X_kLc$ and $X_kLd$ formed on the other face 23b of the board 23 via through holes $31a_k$, $31b_k$, $31c_k$, and $31d_k$.

Then, the one end portions of the cut portions of the loop section $21X_iL$ of the X-axis direction loop coil $21X_i$ formed on the one face 23a of the board 23 and the straight line portions $X_iLb$ and $X_kLb$ of the loop section $21X_kL$ of the X-axis direction loop coil $21X_k$ are connected respectively to the outgoing wiring paths $X_iEs$ and $X_kEs$ of the lead wiring path sections $21X_iE$ and $21X_kE$ via the through holes $31e_i$ and $31e_k$.

Also, the other end portions of the cut portions of the straight line portions $X_iLb$ and $X_kLb$ are connected respectively to the return wiring paths $X_iEg$ and $X_kEg$ of the lead wiring path section $21X_iE$ and the lead wiring path section $21X_kE$ via through holes $31f_i$ and $31f_k$. In this case, the wiring portion of the return wiring path $X_iEg$ of the lead wiring path section $21X_iE$ of the X-axis direction loop coil $21X_i$ other than between the through holes $31f_k$ and $31f_i$ connected to the through hole $31f_k$ is shared for use as the return wiring path $X_kEg$ of the X-axis direction loop coil $21X_k$. That is, the return wiring path $X_iEg$ and the return wiring path $X_kEg$ are configured as a common return wiring path CMg.

Then, the outgoing wiring path $X_iEs$ of the lead wiring path section $21X_iE$ of the X-axis direction loop coil $21X_i$ is disposed in parallel and in proximity to the common return wiring path CMg, and the outgoing wiring path $X_kEs$ of the lead wiring path section $21X_kE$ of the X-axis direction loop coil $21X_k$ is also disposed in parallel and in proximity to the common return wiring path CMg.

Then, as illustrated in FIG. 5, in the position detection sensor 20B of the second embodiment, the common return wiring path CMg is connected to the wiring path 34X on the side of the one face 23a from the side of the other face 23b of the board 23 via the through hole 33X in the region between the position detection area 25 and the connector section 24 outside the position detection area 25. As a result, the common return wiring path CMg is connected to the conductor pattern 26B on the one face 23a of the connector section 24.

As described above, in the second embodiment, a return wiring path running in the X-axis direction is combined with other return wiring path running in the X-axis direction into a single wiring path. This ensures that only three lead wiring paths, one less than in related arts, are required as compared to a total of four lead wiring paths required in related arts, two as the lead wiring path section $21X_iE$ of the X-axis direction loop coil $21X_i$ and two as the lead wiring path section $21X_kE$ of the X-axis direction loop coil $21X_k$.

Then, in the first embodiment, further, the outgoing wiring path $X_iEs$ of the lead wiring path section $21X_iE$ of the X-axis direction loop coil $21X_i$ and the outgoing wiring path $X_kEs$ of the lead wiring path section $21X_kE$ of the X-axis direction loop coil $21X_k$ are formed on the sides of the common return wiring path CMg. For this reason, the through holes $31e_i$ and $31e_k$ are formed at positions straddling the common return wiring path CMg.

Disposing the outgoing wiring path $X_iEs$ and the outgoing wiring path $X_kEs$ on the sides of the common return wiring path CMg as described above ensures that the spacing between the outgoing wiring path $X_iEs$ and the common return wiring path CMg and the spacing between the outgoing wiring path $X_kEs$ and the common return wiring path CMg are equal, and that the two spacings are, for example, 0.1 mm. This keeps an area portion formed by the outgoing wiring path and the return wiring path to a minimum, making it possible to keep the occurrence of an error signal to a minimum.

As described above, it is possible to reduce the total number of return wiring paths of the lead wiring paths drawn out from the X-axis direction loop coil group 21 to half of what it was for each two loop coils of the n loop coils $21X_1$ to $21X_n$ of the X-axis direction loop coil group 21 by combining the return wiring paths of the lead wiring path sections $21X_iE$ to $21X_nE$ into a common wiring path.

Figure 6:
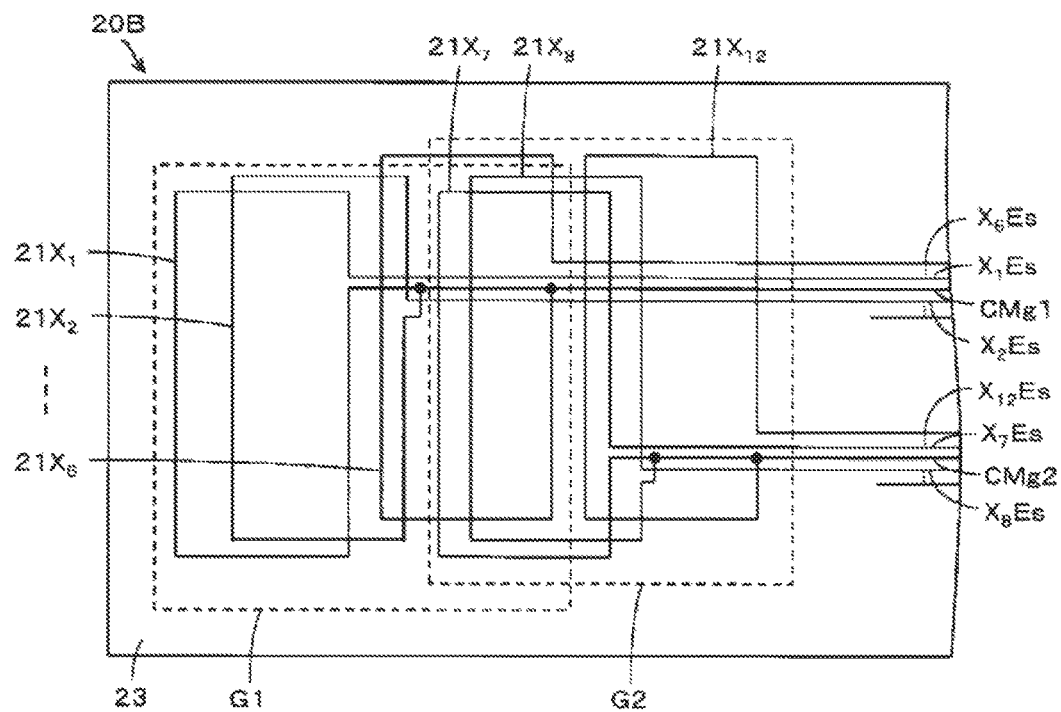
FIG. 6 is a diagram for describing parts of the configuration example of a position detection sensor according to an embodiment of the present disclosure.

Further, it is possible to reduce the total number of return wiring paths of the lead wiring paths drawn out from the X-axis direction loop coil group 21 to an even smaller number by combining the return wiring paths of three or more X-axis direction loop coils into a common wiring path. For example, as illustrated in FIG. 6, the n X-axis direction loop coils $21X_1$ to $21X_n$ of the X-axis direction loop coil group 21 are divided into a plurality of groups G1, G2, and so on, each of which consists of two or more loop coils, so as to combine the return wiring paths into a common wiring path for each group. This makes it possible to reduce the total number of return wiring paths of the lead wiring paths drawn out from the X-axis direction loop coil group 21 to the number of these groups. That is, as illustrated in FIG. 6, it is possible to configure the groups G1, G2, and so on such that one of common return wiring paths CMg1, CMg2, and so on is provided for each group. It should be noted that, needless to say, the numbers of X-axis direction loop coils making up the groups G1, G2, and so on need not be the same and may be different.

As described above, the second embodiment permits reduction of the number of lead wiring paths as compared to related arts by combining the return wiring path of an X-axis direction loop coil with the return wiring path of other X-axis direction loop coil into a common wiring path.

Then, in the second embodiment, the return wiring paths of the X-axis direction loop coils and the Y-axis direction loop coils are provided on the one face 23a of the board 23, the side opposite to the other face 23b of the board 23 where the outgoing wiring paths are formed and connected to the conductor pattern 26B in the connector section 24, making it possible to downsize the connector section 24 as compared to the first embodiment.

Then, also in the position detection sensor 20B of the second embodiment, wiring path patterns running in directions orthogonal to each other are formed on the one face and the other face of the board 23 including in the connector section 24. Even in the event of shrinkage of the copper paste binder caused by a thermal treatment, shrinkage takes place evenly across the entire board as in the above embodiment. This ensures freedom from partial warping or undulation in the board 23.

Then, the dummy conductor pattern 26B of the connector section 24 is not a filled pattern that matches with the entire region of the wiring path patterns on the side of the other face 23b of the board 23. Instead, the dummy conductor pattern 26B has a number of void holes 26Bh, making it possible to avoid attenuation of magnetic fluxes which would occur in the case of a filled pattern due to generation of eddy currents in electromagnetic coupling with the position pointer near the filled pattern.

It should be noted that, in the second embodiment, the dummy conductor pattern 26B is configured in the connector section 24 as a terminal to be connected to a reference potential.

However, one or more common return wiring paths of the lead wiring path section $21X_iE$ from the X-axis direction loop coils $21X_i$ or one or more return wiring paths of the lead wiring path section $22Y_jE$ from the Y-axis direction loop coils $22Y_j$ may be drawn out onto the other face 23b of the connector section 24 and connected to the dummy conductor pattern 26 via a through hole so that the return wiring paths drawn out onto the other face 23b of the connector section 24 are used as terminals to be connected to a reference potential.

It should be noted that all return wiring paths $X_1Eg$ to $X_nEg$ of the lead wiring path sections $21X_1E$ to $21X_nE$ of the n X-axis direction loop coils $21X_1$ to $21X_n$ may be naturally combined into the single common return wiring path CMg.

Also, although the above second embodiment was described only in relation to the X-axis direction loop coil group 21, the second embodiment is applicable to the Y-axis direction loop coil group 22 in completely the same manner. In this case, the minimum number of the return wiring paths of the lead wiring path sections can be reduced to two, one for the X-axis direction loop coil group 21 and one for the Y-axis direction loop coil group 22.

It should be noted that the above technique of combining the return wiring paths of the lead wiring path sections from the X-axis direction loop coil group 21 and the Y-axis direction loop coil group 22 described above may be naturally applied to the first embodiment in which all the lead wiring path sections are drawn out onto the other face 23b of the board 23.

[Third Embodiment of Position Detection Sensor]

Figure 7:
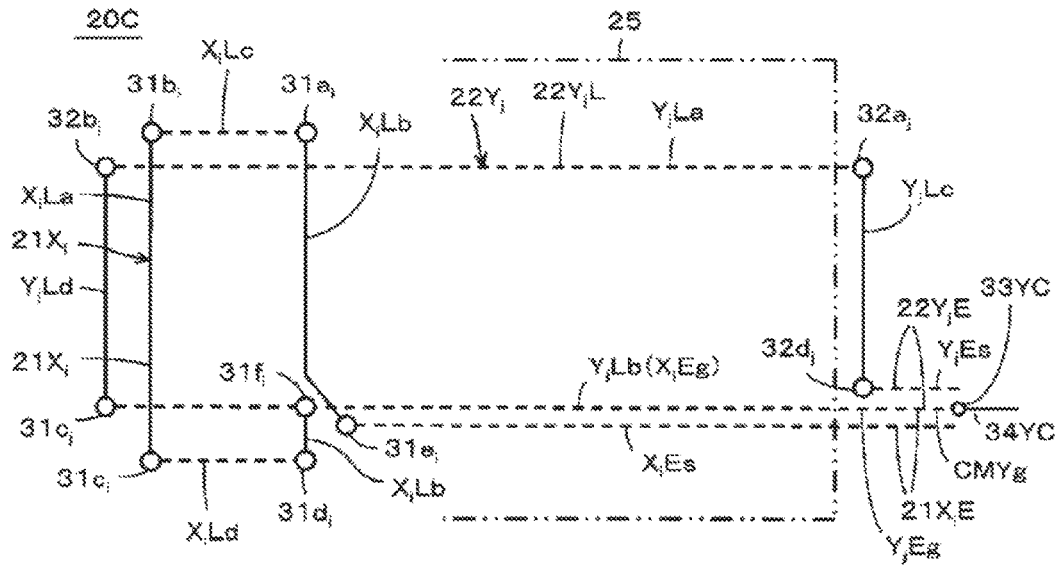
FIG. 7 is a diagram for describing parts of a configuration example of a position detection sensor according to an embodiment of the present disclosure.
Figure 8:
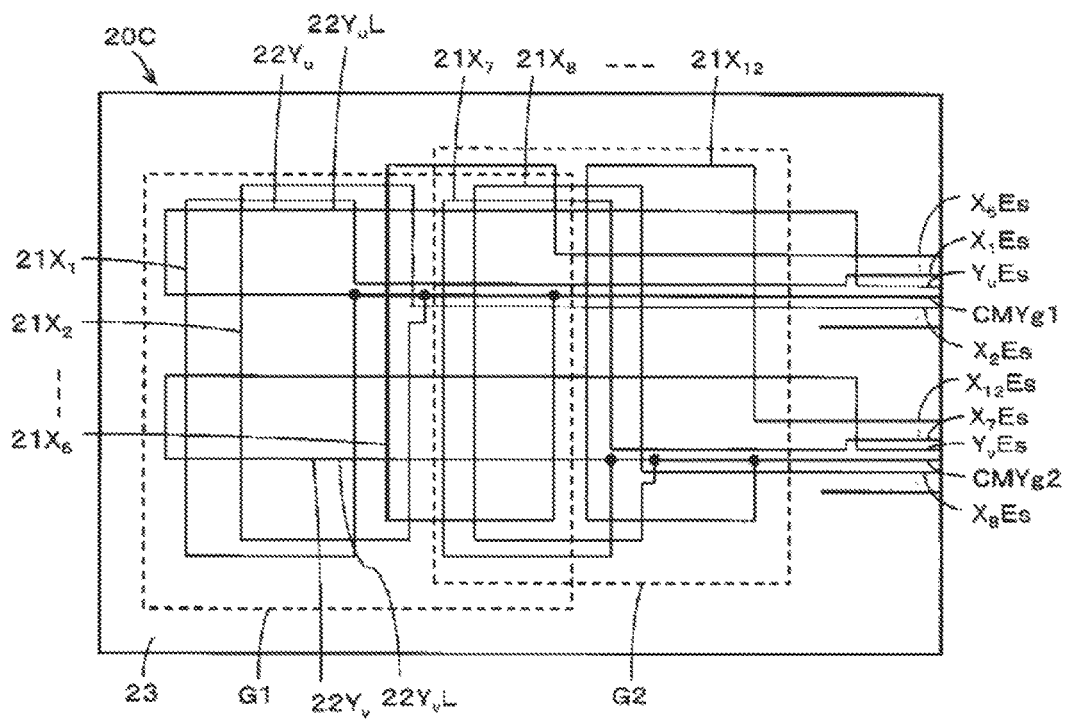
FIG. 8 is a diagram for describing parts of the configuration example of a position detection sensor according to an embodiment of the present disclosure.

A position detection sensor 20C of a third embodiment is a modification example of the position detection sensor 20B of the second embodiment. FIG. 7 and FIG. 8 are diagrams for describing a configuration example of the position detection sensor 20C of the third embodiment. In FIG. 7 and FIG. 8, the same parts as those of the position detection sensor 20B of the second embodiment will be denoted by the same reference symbols, and a detailed description thereof will be omitted.

In the third embodiment, the return wiring path $X_iEg$ of the lead wiring path section $21X_iE$ of the X-axis direction loop coil $21X_i$ are combined with one straight line portion $Y_jLb$ of the loop section $22Y_jL$ of the Y-axis direction loop coil $22Y_j$ into a common wiring path by connecting the return wiring path $X_iEg$ to the straight line portion $Y_jLb$ for use as part of the straight line portion $Y_jLb$, further reducing the total number of lead wiring paths for connection from the X-axis direction loop coil group 21 to the connector section 24 outside the position detection area 25. This ensures reduced concentration and imbalance of the wiring path patterns caused by the existence of the lead wiring paths other than the lead wiring paths of the loop sections of the loop coils in the position detection area 25 as compared to the first embodiment and the second embodiment.

It should be noted that the solid straight lines in FIG. 7 represent the wiring paths formed on the one face 23a of the board 23, and the dotted straight lines represent the wiring paths formed on the other face 23b of the board 23 as in FIG. 1A.

That is, as depicted in FIG. 7, the loop section $22Y_jL$ of the Y-axis direction loop coil $22Y_j$ is formed as a result of connection of the straight line portions $Y_jLa$ and $Y_jLb$ running in the X-axis direction on the side of the other face 23b of the board and the straight line portions $Y_jLc$ and $Y_jLd$ running in the Y-axis direction on the side of the one face 23a via the through holes $32a_j$, $32b_j$, and $32c_j$.

Then, as described earlier, the straight line portion $Y_jLc$ on the one face 23a of the board 23 is connected, via the through hole $32d_j$, to the outgoing wiring path $Y_jEs$ formed outside the position detection area 25 in parallel to the X-axis direction on the other face 23b of the board 23. Also, the straight line portion $Y_jLb$ running in the X-axis direction formed on the side of the other face 23b of the board 23 is further extended in the X-axis direction outside the position detection area 25 and serves as the return wiring path $Y_jEg$.

On the other hand, the loop section $21X_iL$ of the X-axis direction loop coil $21X_i$ is formed as a result of connection of the straight line portions $X_iLa$ and $X_iLb$ on the side of the one face 23a of the board 23 and the straight line portions $X_iLc$ and $X_iLd$ on the side of the other face 23b via the through holes $31a_i$, $31b_i$, $31c_i$, and $31d_i$ as in FIG. 5.

Then, the one end portion of the cut portion of the straight line portion $X_iLb$ formed on the one face 23a of the board 23 is connected, via the through hole $31e_i$, to the outgoing wiring path $X_iEs$ of the lead wiring path section $21X_iE$ formed on the side of the other face 23b of the board 23. The outgoing wiring path $X_iEs$ is disposed in parallel and in proximity to the straight line portion $Y_jLb$ of the loop section $22Y_jL$ of the Y-axis direction loop coil $22Y_j$.

Then, in the third embodiment, the other end portion of the cut portion of the straight line portion $X_iLb$ is connected, via the through hole $31f_i$, to an intermediate portion of the straight line portion $Y_jLb$ of the loop section $22Y_jL$ of the Y-axis direction loop coil $22Y_j$. The straight line portion $Y_jLb$ of the loop section $22Y_jL$ is a wiring path whose extended portion serves as the return wiring path $Y_jEg$ of the lead wiring path section $22Y_jE$ of the Y-axis direction loop coil $22Y_j$ as described earlier.

Then, as described earlier, the straight line portion $Y_jLb$ of the loop section $22Y_jL$ of the Y-axis direction loop coil $22Y_j$ is disposed in parallel and in proximity to the outgoing wiring path $X_iEs$ of the lead wiring path section $21X_iE$ of the X-axis direction loop coil $21X_i$.

Therefore, the part of the straight line portion $Y_jLb$ of the loop section $22Y_jL$ of the Y-axis direction loop coil $22Y_j$ from a connection point with the straight line portion $X_iLb$ of the X-axis direction loop coil $21X_i$ via the through hole $31f_i$ to the connector section 24 is shared as the return wiring path $X_iEg$ of the lead wiring path section $21X_iE$ of the X-axis direction loop coil $21X_i$.

Then, in the third embodiment, the lead wiring path section $21X_iE$ of the X-axis direction loop coil $21X_i$ and the lead wiring path section $22Y_jE$ of the Y-axis direction loop coils $22Y_j$ for connection from the position detection area 25 to the connector section 24 (not depicted in FIG. 7) outside the position detection area 25 are configured to have a common return wiring path CMYg. Then, as illustrated in FIG. 7, the common return wiring path CMYg is connected from the other face 23b of the board 23 to the one face 23a via a through hole 33YC and is connected to the conductor pattern 26B illustrated in FIGS. 4A and 4B via a wiring path 34YC.

As described above, in the third embodiment, it is no longer necessary to provide an individual return wiring path for the lead wiring path section $21X_iE$ from the X-axis direction loop coils $21X_i$, making it possible to reduce the number of lead wiring paths by an equal number.

Then, because it is possible to eliminate the need for a return wiring path as a lead wiring path section from each of the X-axis direction loop coils of the X-axis direction loop coil group 21, the number of return wiring paths of the lead wiring path sections from the X-axis direction loop coil group 21 and the Y-axis direction loop coil group 22 as a whole can be reduced to an equal number of the Y-axis direction loop coils. Therefore, it is possible to reduce the number of return wiring paths of the lead wiring path sections from the X-axis direction loop coil group 21 and the Y-axis direction loop coil group 22 as a whole even further as compared to the second embodiment.

FIG. 8 illustrates a case in which the third embodiment is applied to the example of the second embodiment depicted in FIG. 6. In the example of FIG. 8, return wiring paths of the X-axis direction loop coils $21X_1$ to $21X_6$ of the group G1 are shared with some of loop sections $22Y_uL$ of Y-axis direction loop coils $22Y_u$ and drawn out of the position detection area 25 as a common return wiring path CMYg1. Also, return wiring paths of the X-axis direction loop coils $21X_7$ to $21X_{12}$ of the group G2 are shared with some of loop sections $22Y_vL$ of the Y-axis direction loop coils $22Y_v$ and drawn out of the position detection area 25 as a common return wiring path CMYg2.

[Modification Example of Above Embodiment]

It should be noted that, in the above embodiment, although the connector section 24 is provided on one side in the X-axis direction of the board 23, a connector section may be provided on one side in the Y-axis direction of the board 23.

Also, the method by which wiring path patterns are substantially formed in the conductor pattern 26 or 26B provided in the connector section 24 is not limited to the method, as above embodiment, in which slits are provided or void holes are provided. Instead, any method may be used as long as wiring path patterns orthogonal to extended portions of the lead wiring paths formed on the side of the other face of the connector section 24 can be substantially formed.

Figure 9A:
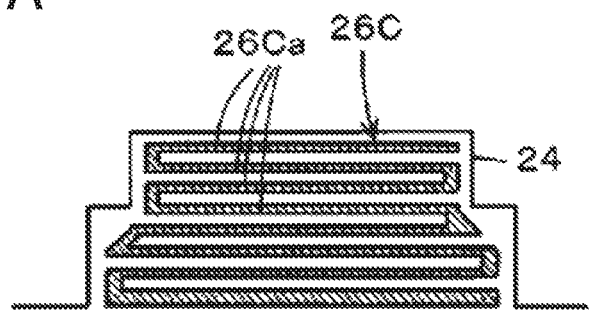
FIGS. 9A, 9B, and 9C depict diagrams for describing other configuration examples of a position detection sensor according to an embodiment of the present disclosure.
Figure 9B:
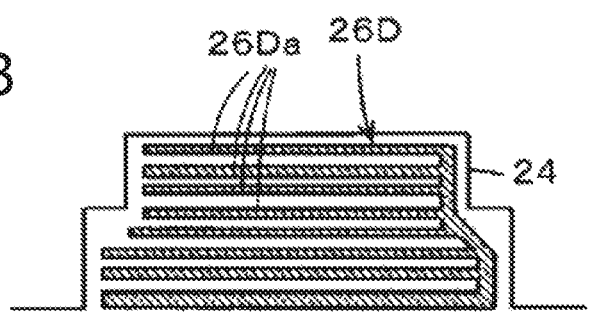

For example, a conductor pattern 26C illustrated in FIG. 9A is formed as a so-called zigzag wiring path pattern with each of a plurality of wiring path patterns 26Ca connected alternately at one or other end portion of the respective wiring path patterns 26Ca. Also, a conductor pattern 26D illustrated in FIG. 9B is a pattern in which a plurality of wiring path patterns 26Da are coupled only at their one end portions. In FIG. 9B, it is needless to say that areas where the plurality of wiring path patterns 26Da is coupled may be located on the side of other end portions of the plurality of wiring path patterns 26Da. Also, a conductor pattern 26E illustrated in FIG. 9C is a pattern in which a plurality of wiring path patterns 26Ea are coupled individually at center portions of the respective wiring path patterns 26Ea.

Figure 9C:
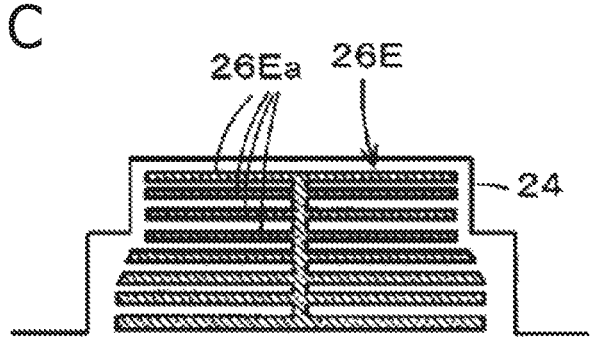
Figure 10A:
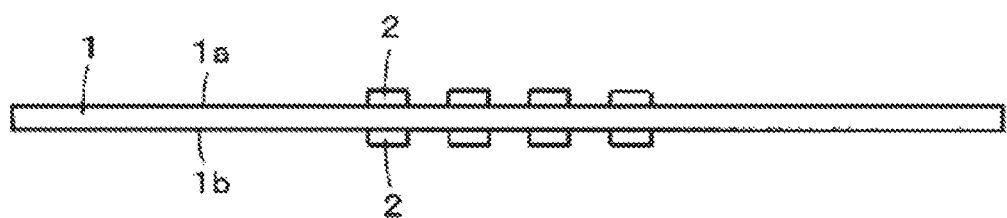
FIGS. 10A, 10B, and 10C depict diagrams for describing technical challenges to be solved by a position detection sensor according to an embodiment of the present disclosure.
Figure 10B:
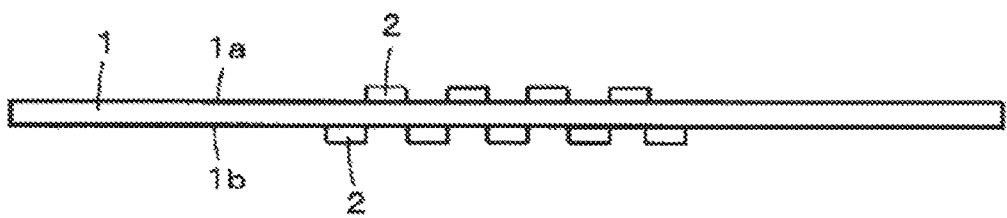
Figure 10C:
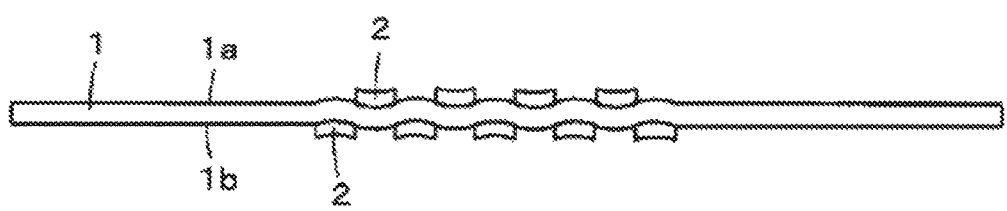

It should be noted that all the examples illustrated in FIGS. 9A, 9B, and 9C are cases in which the conductor patterns 26C, 26D, and 26E are terminals that can supply a reference potential. If it is not necessary to use the conductor patterns 26C, 26D, and 26E as terminals for supplying a reference potential, as described in the first embodiment, the conductor patterns 26Ca, 26Da, and 26Ea may be wiring path patterns (dummy patterns) that are independent of each other as described earlier.

DESCRIPTION OF REFERENCE SYMBOLS 20, 20A, 20B, 20C—Position detection sensor, 21—X-axis direction loop coil group, 22—Y-axis direction loop coil group, 23—Sheet-shaped board made of polyimide-based resin, 24—Connector section, 25—Position detection area, 26—Dummy conductor pattern, 26A—Conductor pattern that assumes reference potential

The invention claimed is:
1. An electromagnetic induction position detection sensor comprising:

a wiring path pattern made using copper paste including copper powder and a binder formed on a board made of resin, the wiring path pattern having been thermally treated, wherein:

the wiring path pattern includes a plurality of position detection loop coils and a connector section that connects the position detection loop coils to external circuitry, each of the position detection loop coils includes a plurality of first portions that extend on a first surface of the board in a first direction, and a plurality of second portions that extend on a second surface of the board in a second direction that is orthogonal to the first direction, and the wiring path pattern is disposed on the first surface and the second surface of the board in the connector section.

2. The electromagnetic induction position detection sensor of claim 1, wherein:

the connector section is provided, at an end portion of the board, the connector section includes a plurality of extended portions of lead wiring paths, and each of the extended portions of lead wiring paths is electrically coupled to one of the first and second portions of one of the position detection loop coils, and portions of the wiring path pattern that extend on the first surface of the board in the connector section are orthogonal to portions of the wiring path pattern that extend on the second surface of the board in the connector section.

3. The electromagnetic induction position detection sensor of claim 1, wherein the position detection loop coils include:

a first loop coil group in which a plurality of first loop coils is arranged in the second direction, the first and second portions of each of the first loop coils forming a first loop section that surrounds a region of a first given area, and each of the first loop coils has a first lead wiring path section that is connected to a first end and a second end of each first loop section, and a second loop coil group in which a plurality of second loop coils is arranged in the first direction, the first and second portions of each of the second loop coils forming a second loop section that surrounds a region of a second given area, wherein a second lead wiring path section that is connected to a first end and a second end of each second loop section, wherein a region occupied by each first loop section and each second loop section of the first loop coil group and the second loop coil group is a position detection area, wherein the first lead wiring path section for each of the first loop coils and the second lead wiring path section for each of the second loop coils are disposed on the first surface or the second surface of the board and are disposed in the connector section such that one of the first lead wiring path section for each of the first loop coils and the second lead wiring path section for each of the second loop coils passes through the position detection area, and a second one of the first lead wiring path section for each of the first loop coils and the second lead wiring path section for each of the second loop coils does not pass through the position detection area, and wherein portions of the wiring path pattern formed on the first surface of the board in the connector section are orthogonal to portions of the wiring path pattern formed on the second surface of the board in the connector section.

4. The electromagnetic induction position detection sensor of claim 3, wherein the first lead wiring path section for each of the first loop coils and the second lead wiring path section for each of the second loop coils are routed in a given extension direction on a first one of the first surface and the second surface of the board in the connector section, and a pattern is formed on a second one of the first surface and the second surface of the board in the connector section such that conductor wiring paths are formed in a direction orthogonal to the given extension direction of the first lead wiring path section for each of the first loop coils and the second lead wiring path section for each of the second loop coils.

5. The electromagnetic induction position detection sensor of claim 4, wherein the pattern formed on the second one of the first surface and the second surface of the board in the connector section includes a plurality of wiring path patterns running in the direction orthogonal to the given extension direction of the first lead wiring path section for each of the first loop coils and the second lead wiring path section for each of the second loop coils.

6. The electromagnetic induction position detection sensor of claim 4, wherein:

the first lead wiring path section for each of the first loop coils and the second lead wiring path section for each of the second loop coils have a first wiring path to which a signal is supplied or from which a signal is extracted and a second wiring path that, in operation, is connected to a reference potential, and the second wiring path of the first lead wiring path section for a first one of the first loop coils and the second wiring path of the first lead wiring path section for a second one of the first loop coils are combined into a common wiring path, and the first wiring path of the first lead wiring path section for the first one of the first loop coils and the first wiring path of the first lead wiring path section for the second one of the first loop coils are disposed in parallel.

7. The electromagnetic induction position detection sensor of claim 6, wherein the second wiring path of the first lead wiring path section for the first one of the first loop coils and the second wiring path of the first lead wiring path section for the second one of the first loop coils that have been combined into the common wiring path make up part of the second loop section of one of the second loop coils and the second wiring path of the second lead wiring path section of the one of the second loop coils.

8. The electromagnetic induction position detection sensor of claim 3, wherein:

the first lead wiring path section for each of the first loop coils and the second lead wiring path section of each of the second loop coils have a first wiring path to which a signal is supplied or from which a signal is extracted and a second wiring path which, in operation, is connected to a reference potential, on a first one of the first surface and the second surface of the board in the connector section, the first wiring paths of the first lead wiring path section for each of the first loop coils and the second lead wiring path section for each of the second loop coils are formed in an extension direction thereof, and on a second one of the first surface and the second surface of the board in the connector section, a pattern to which the second wiring paths of the first lead wiring path section for each of the first loop coils and the second lead wiring path section for each of the second loop coils are connected is formed such that conductor wiring paths are formed in a direction orthogonal to the extension direction of the first wiring paths.

9. The electromagnetic induction position detection sensor of claim 8, wherein the second wiring path of the first lead wiring path section for a first one of the first loop coils and the second wiring path of the first lead wiring path section for a second one of the first loop coils are combined into a common wiring path, and the first wiring path of the first lead wiring path section for the first one of the first loop coils and the first wiring path of the first lead wiring path section for the second one of the first loop coils that have been combined into the common wiring path are disposed in parallel.

10. The electromagnetic induction position detection sensor of claim 9, wherein the second wiring path of the first lead wiring path section for the first one of the first loop coils and the second wiring path of the first lead wiring path section for the second one of the first loop coils that have been combined into the common wiring path make up part of the second loop section of one of the second loop coils and the second wiring path of the second lead wiring path section for the one of the second loop coils.

11. The electromagnetic induction position detection sensor of claim 8, wherein the wiring path pattern formed on the second one of the first surface and the second surface of the board in the connector section includes a pattern having a plurality of conductors running in a direction orthogonal to the extension direction of the first wiring paths, the conductors being connected to each other.

12. The electromagnetic induction position detection sensor of claim 11, wherein in the pattern formed on the second one of the first surface and the second surface of the board in the connector section, the plurality of conductors running in the direction orthogonal to the extension direction of the first wiring paths is formed by a plurality of slits running in the direction orthogonal to the extension direction of the first wiring paths.

13. The electromagnetic induction position detection sensor of claim 11, wherein in the pattern formed on the second one of the first surface and the second surface of the board in the connector section, the plurality of conductors running in the direction orthogonal to the extension direction of the first wiring paths is formed by a plurality of void holes running in the direction orthogonal to the extension direction of the first wiring paths.

14. The electromagnetic induction position detection sensor of claim 1, wherein the wiring path pattern is formed by thermally treating the copper paste and the board at 340° C.

15. A method of forming an electromagnetic induction position detection sensor, the method comprising:
   forming, on a board made of resin, a wiring path pattern using copper paste, the copper paste including copper powder and a binder, wherein:
      the wiring path pattern includes a plurality of position detection loop coils and a connector section that connects the position detection loop coils to external circuitry,
      each of the position detection loop coils includes a plurality of first portions that extend on a first surface of the board in a first direction, and a plurality of second portions that extend on a second surface of the board in a second direction that is orthogonal to the first direction, and
      the wiring path pattern is disposed on the first surface and the second surface in the connector section; and
   thermally treating the wiring path pattern formed on the board.

16. The method of claim 15, wherein the thermally treating of the wiring path pattern formed on the board includes thermally treating the copper paste and the board in a temperature range from 320° C. to 370° C.

17. The method of claim 16, wherein the thermally treating of the wiring path pattern formed on the board includes thermally treating the copper paste and the board at 340° C.

18. The method of claim 17, wherein the thermally treating of the wiring path pattern formed on the board includes thermally treating the copper paste and the board using steam.

19. The method of claim 18, wherein the thermally treating of the wiring path pattern formed on the board includes thermally treating the copper paste and the board using steam for one minute to two minutes.

20. The method of claim 19, wherein the resin is polyimide-based resin.

* * * * *